(12) United States Patent
Fu

(10) Patent No.: US 11,375,619 B2
(45) Date of Patent: Jun. 28, 2022

(54) METHOD FOR MANUFACTURING A PACKAGING STRUCTURE

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventor: Chih-Chieh Fu, New Taipei (TW)

(73) Assignees: HongQiSheng Precision Electronics (QinHuangDao) Co., Ltd., Qinhuangdao (CN); Avary Holding (Shenzhen) Co., Limited., Shenzhen (CN)

(*) Notice: Subject to any disclaimer, the term of this patent is extended or adjusted under 35 U.S.C. 154(b) by 0 days.

(21) Appl. No.: 17/054,504

(22) PCT Filed: Sep. 24, 2019

(86) PCT No.: PCT/CN2019/107510
§ 371 (c)(1),
(2) Date: Nov. 10, 2020

(87) PCT Pub. No.: WO2021/056181
PCT Pub. Date: Apr. 1, 2021

(65) Prior Publication Data
US 2021/0368626 A1    Nov. 25, 2021

(51) Int. Cl.
*H05K 3/46*        (2006.01)
*H05K 1/18*        (2006.01)
(Continued)

(52) U.S. Cl.
CPC ......... *H05K 1/186* (2013.01); *H05K 3/4697* (2013.01); *H05K 3/0017* (2013.01); *H05K 3/02* (2013.01); *H05K 2201/09227* (2013.01)

(58) Field of Classification Search
CPC ...... H05K 3/4697; H05K 3/0017; H05K 3/02; H05K 1/186; H05K 2201/09227; H01L 23/31; Y10T 29/4913; Y10T 29/49146
(Continued)

(56) References Cited

U.S. PATENT DOCUMENTS 6,846,704 B2 * 1/2005 Paek .................. H01L 23/3114
                                                                        438/106
10,129,982 B2 * 11/2018 Choi ...................... H05K 3/306
(Continued)

FOREIGN PATENT DOCUMENTS

CN            1906986 A        1/2007

*Primary Examiner* — Donghai D Nguyen
(74) *Attorney, Agent, or Firm* — ScienBiziP, P.C.

(57) ABSTRACT

A packaging structure, includes: a dielectric layer; at least one inner wiring layer embedded in the dielectric layer; at least two outer wiring layers arranged two sides of the at least one inner wiring layer and combined with the dielectric layer; and at least one electronic component embedded in the dielectric layer; each inner wiring layer including at least two spaced supporting pads, and each supporting pad including a main body and a protruding portion extending outward from a periphery of the main body, the packaging structure further including at least two spaced positioning pillars, and each positioning pillar correspondingly connected to one main body, each electronic component arranged between at least two positioning pillars, and an end of each electronic component being in contact with protruding portions of at least two supporting pads, thereby packaging the electronic component accurately. The present invention also needs to provide a method for manufacturing the packaging structure.

7 Claims, 4 Drawing Sheets

(51) Int. Cl.
*H05K 3/00* (2006.01)
*H05K 3/02* (2006.01)

(58) Field of Classification Search
USPC .......................................... 29/832, 841, 846
See application file for complete search history.

(56) References Cited

U.S. PATENT DOCUMENTS

| | | | |
|---|---|---|---|
| 10,531,559 B2* | 1/2020 | Tanaka | H05K 3/34 |
| 10,827,604 B2* | 11/2020 | Okunaga | H05K 3/4682 |
| 2007/0158101 A1 | 7/2007 | Chikagawa et al. | |
| 2010/0212152 A1 | 8/2010 | Chikagawa et al. | |
| 2013/0044448 A1 | 2/2013 | Primavera | |
| 2013/0048361 A1 | 2/2013 | Yamashita et al. | |
| 2016/0270233 A1* | 9/2016 | Ha | H05K 3/4605 |

* cited by examiner

METHOD FOR MANUFACTURING A PACKAGING STRUCTURE

FIELD

The subject matter herein generally relates to a field of packaging, especially to a packaging structure and a method for manufacturing the same.

BACKGROUND

In the existing packaging process of embedded components, when the electronic components are embedded, a peelable adhesive layer is used to support the electronic components, and the peelable adhesive layer is torn off after encapsulating the side of the electronic components facing away from the peelable adhesive layer, then the other side of the electronic components is encapsulated. The above packaging process requires glue to be applied and then peeled off, and the steps are complicated and easy to leave residual glue.

SUMMARY

What is needed, is a method for manufacturing a packaging structure with simple manufacturing process and precise packaging.

What is also needed, is a packaging structure.

A method for manufacturing a packaging structure includes the following steps:

providing a substrate including an insulating layer and a first metal layer formed on a side of the insulating layer;

forming at least two spaced grooves on the substrate, each groove passing through the first metal layer and a part of the insulating layer;

forming a positioning pillar corresponding to the groove to fill the groove, and forming an inner circuit board by performing a circuit manufacturing technology on the substrate, wherein the first metal layer correspondingly forms a first inner wiring layer, the first inner wiring layer includes at least two spaced supporting pads, and each supporting pad includes a main body and a protruding portion extending outward from a periphery of the main body, the main body corresponds to the positioning pillar;

forming at least one opening passing through the inner circuit board, each opening exposing a partial region of each of protruding portions of at least two supporting pads;

placing an electronic component in the opening, and supporting the electronic component by the protruding portions to form an intermediate structure;

forming a first outer circuit board and a second outer circuit board respectively on opposite sides of the intermediate structure to encapsulate the electronic component, thereby obtaining the packaging structure.

Further, the step of "forming at least one opening passing through the inner circuit board" further includes: a part of a surface of each positioning pillar facing away from the corresponding supporting pads is exposed from the opening.

Further, the substrate further includes a second metal layer formed on a side of the insulating layer facing away from the first metal layer, the step of "forming a positioning pillar corresponding to the groove to fill the groove, and forming an inner circuit board by performing a circuit manufacturing technology on the substrate" further includes: the second metal layer correspondingly forms a second inner wiring layer.

Further, at least one connecting pad is formed on at least one of a side of the electronic component facing the first inner wiring layer and a side of the electronic component facing away from the first inner wiring layer, the electronic component is electrically connected to at least one of the first outer circuit board and the second outer circuit board through the connecting pad.

Further, the first outer circuit board includes a first dielectric layer and a first outer wiring layer, the first dielectric layer is combined with the first inner wiring layer and fills the opening, the first outer wiring layer is arranged on a side of the first dielectric layer facing away from the first inner wiring layer.

Further, the second outer circuit board includes a second dielectric layer and a second outer wiring layer, the second dielectric layer is combined with a side of the inner circuit board facing away from the first inner wiring layer and fills the opening, the second outer wiring layer is arranged on a side of the second dielectric layer facing away from the inner circuit board.

Further, lengths of the protruding portions extending in different directions from the periphery of the main body are the same or different.

A packaging structure includes:

a dielectric layer;

at least one inner wiring layer embedded in the dielectric layer;

at least two outer wiring layers arranged two sides of the at least one inner wiring layer and combined with the dielectric layer; and at least one electronic component embedded in the dielectric layer;

each inner wiring layer including at least two spaced supporting pads, and each supporting pad including a main body and a protruding portion extending outward from a periphery of the main body, the packaging structure further including at least two spaced positioning pillars, and each positioning pillar correspondingly connected to one main body, each electronic component arranged between at least two positioning pillars, and an end of each electronic component being in contact with protruding portions of at least two supporting pads.

Further, lengths of the protruding portions extending in different directions from the periphery of the main body are the same or different.

Further, at least one connecting pad is formed on at least one of a side of the electronic component facing the first inner wiring layer and a side of the electronic component facing away from the inner wiring layer contacting the electronic component, the electronic component is electrically connected to the outer wiring layer through the connecting pad.

In the method for manufacturing the packaging structure, when the electronic component is installed, the protruding portions exposed from the opening is used to support the electronic component to instead of the traditional peelable adhesive layer to support the electronic component, thereby avoiding a problem of residual glue that exists when the peelable adhesive layer is removed, and the step of the sticking adhesive layer and tearing the adhesive layer; supporting the electronic component by the protruding portions exposed from the opening may also simultaneously perform packaging on both sides of the inner circuit board where the electronic component is mounted, simplifying the packaging process and preventing a prepreg line from being produced by a secondary compression during packaging. Secondly, the electronic component is installed between at least two positioning posts, to position the electronic component when the electronic component is packaged, thereby improving the packaging accuracy of the electronic component.

Description of symbols for main elements: 100 represents a packaging structure, 10 represents a substrate, 11 represents a first metal layer, 13 represents an insulating layer, 15 represents a second metal layer, 16 represents a groove, 161 represents a first portion, 163 represents a second portion, 20 represents a positioning pillar, 10a represents an inner circuit board, 110 represents a first inner wiring layer, 150 represents a second inner wiring layer, 113 and 71 represent supporting pads, 113a and 713 represent main bodies, 113b and 715 respectively represent protruding portions, 101 represents an opening, 30 represents an electronic component, 200 represents an intermediate structure, 31 represents a connecting pad, 40 represents a first outer circuit board, 50 represents a second outer circuit board, 41 represents a first dielectric layer, 43 represents a first outer wiring layer, 51 represents a second dielectric layer, 53 represents a second outer wiring layer, 50a represents a first single-sided board, 50b represents a second single-sided board, 43a represents a first metal foil, 53a represents a second metal foil, 45 represents an electrically conductive structure, 60 represents a dielectric layer, 70 represents an inner wiring layer, 80 represents an outer wiring layer.

Implementations of the disclosure will now be described, with reference to the drawings.

DETAILED DESCRIPTION

Implementations of the disclosure will now be described clearly and completely, by way of embodiments only, with reference to the drawings. Obviously, the described embodiments are only a part of the embodiments of the present invention, but not all of the embodiments. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are not to be considered as limiting the scope of the embodiments.

Implementations of the disclosure will now be described, by way of embodiments only, with reference to the drawings. It should be noted that non-conflicting details and features in the embodiments of the present disclosure may be combined with each other.

Figure 1:
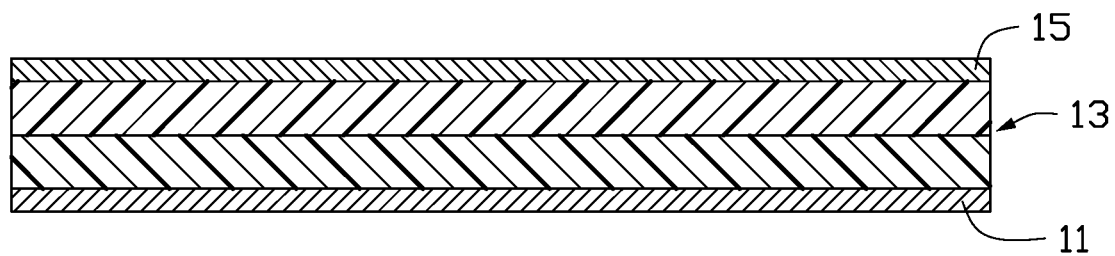
FIG. 1 is a schematic cross-sectional diagram of a substrate of an embodiment of the present invention.

Referring to FIG. 1 to FIG. 7, an embodiment of the present invention of a method for manufacturing a packaging structure includes the following steps:

Step S1, referring to FIG. 1, a substrate 10 is provided, the substrate 10 include a first metal layer 11, an insulating layer 13 and a second metal layer 15 stacked in the order written.

In this embodiment, the insulating 13 may be selected from but not limited to at least one of polypropylene, epoxy resin, polyurethane, phenolic resin, urea-formaldehyde resin, melamine-formaldehyde resin, liquid crystal polymer, polyimide, polyetheretherketone, polyethylene terephthalate and polyethylene naphthalate, etc.

In another embodiment, the substrate 10 may be a single-sided board or a multi-board.

Figure 2:
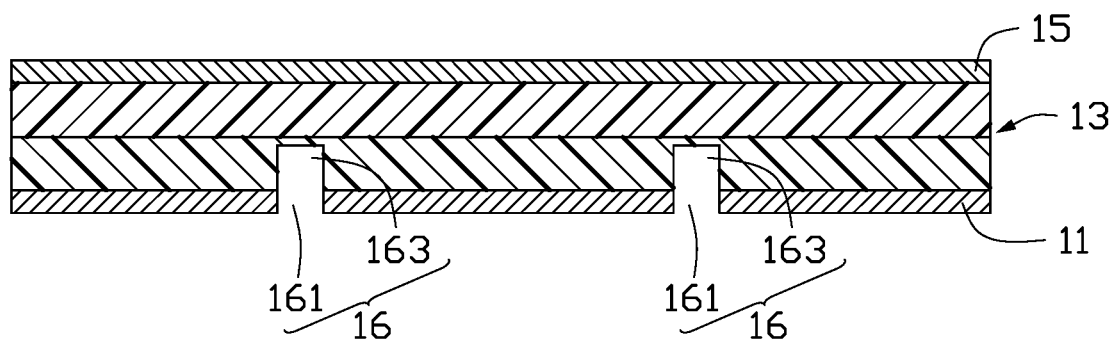
FIG. 2 is a schematic cross-sectional view of forming grooves on the substrate shown in FIG. 1.

Step S2, referring to FIG. 2, at least two spaced grooves 16 are formed on the substrate 10, each groove 16 passes through the first metal layer 11 and a part of the insulating layer 13.

Specifically, each groove 16 includes a first portion 161 penetrating the first metal layer 11 and a second portion 163 extending from a surface of the insulating layer 13 where the first metal layer 11 is provided toward in a direction away from the first metal layer 11.

In this embodiment, the grooves 16 may be formed by, but not limited to, laser cutting, routing, or the like.

Figure 3:
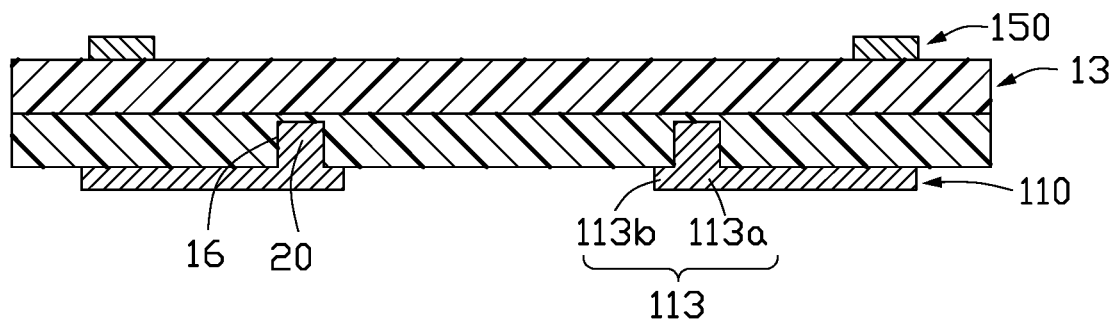
FIG. 3 is a schematic cross-sectional view of an inner circuit board of an embodiment of the present invention.

Step S3, referring to FIG. 3, a positioning pillar 20 corresponding to the groove 16 is formed to fill the groove 16, and an inner circuit board 10a is formed by performing a circuit manufacturing technology on the substrate 10, wherein the first metal layer 11 correspondingly forms a first inner wiring layer 110, the second metal layer 15 correspondingly forms a second inner wiring layer 150, the first inner wiring layer 110 includes at least two spaced supporting pads 113, and each supporting pad 113 includes a main body 113a and a protruding portion 113b extending outward from a periphery of the main body 113a, the main body 113a corresponds to the positioning pillar 20.

In this embodiment, the positioning pillar 20 is formed by electroplating. The positioning pillar 20 fully fills the groove 16. In another embodiment, the positioning pillar 20 may also be formed by other methods such as vapor deposition.

Lengths of the protruding portions 113b extending in different directions from the periphery of the main body 113a are the same or different.

Figure 4:
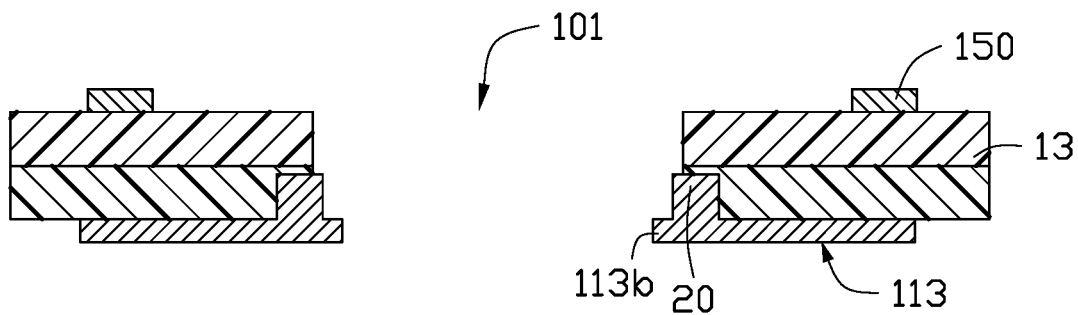
FIG. 4 is a schematic cross-sectional view of forming an opening on the inner circuit board shown in FIG. 3.

Step S4, referring to FIG. 4, at least one opening 101 passing through the inner circuit board 10a is formed. Each opening 101 exposes a partial region of each of the protruding portions 113b of at least two supporting pads 113.

In this embodiment, a partial region of a surface of each positioning pillar 20 facing away from the corresponding supporting pad 113 is exposed from the opening 101.

Figure 5:
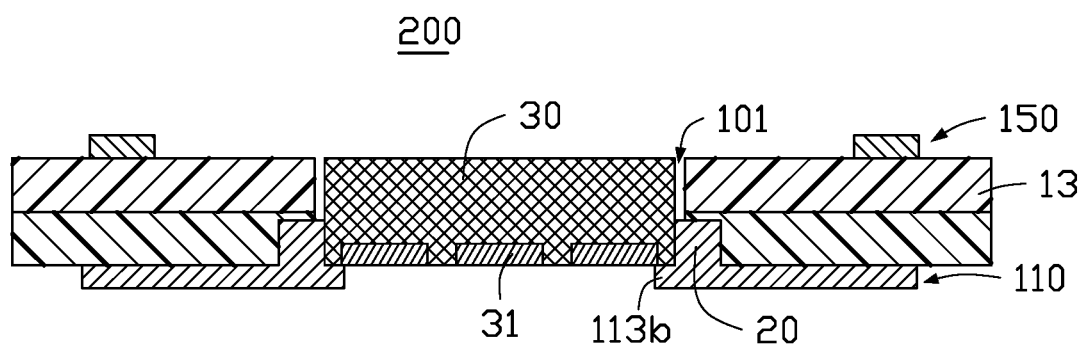
FIG. 5 is a schematic cross-sectional view of installing an electronic component in the inner circuit board shown in FIG. 4 to form an intermediate structure.

Step S5, referring to FIG. 5, an electronic component 30 is placed in the opening 101 and supported by the protruding portions 113b, thereby forming an intermediate structure 200.

In this embodiment, at least one connecting pad 31 is formed on a side of the electronic component 30 facing the first inner wiring layer 110. The connecting pad 31 is arranged between the protruding portions 113b supporting the electronic component 30.

In another embodiment, the connecting pad 31 may also formed on a side of the electronic component 30 facing away from the first inner wiring layer 110.

Figure 6:
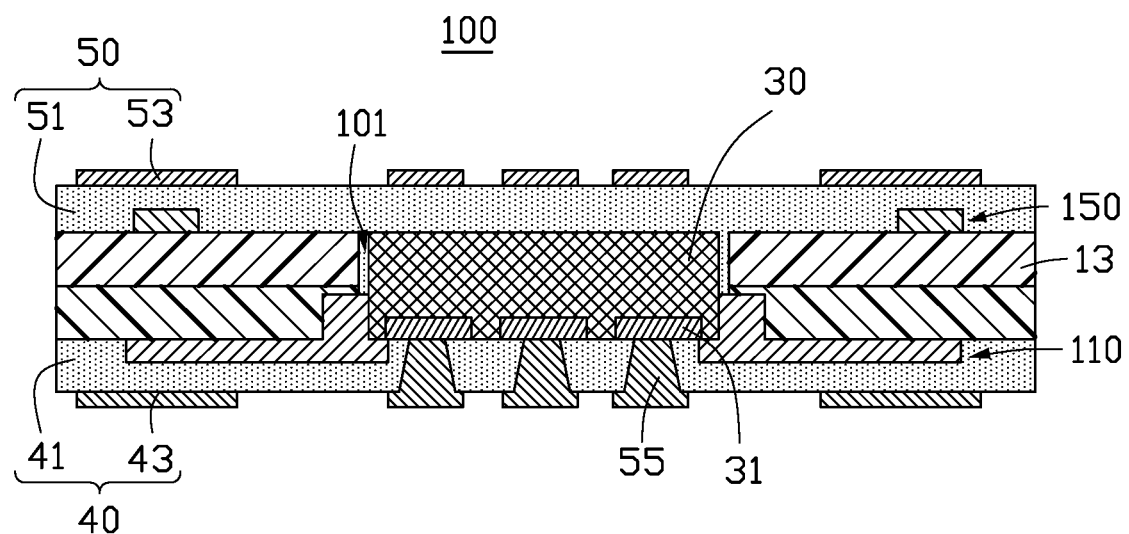
FIG. 6 is a schematic cross-sectional view of encapsulating the electronic component shown in FIG. 5 to obtain a packaging structure.

Step S6, referring to FIG. 6, a first outer circuit board 40 and a second outer circuit board 50 are respectively formed on opposite sides of the intermediate structure 200 to encapsulate the electronic component 30, thereby obtaining the packaging structure 100.

In this embodiment, the first outer circuit board 40 formed on the first inner wiring layer 110 is electrically connected to the electronic component 30.

In another embodiment, the second outer circuit board 50 is electrically connected to the electronic component 30.

In this embodiment, the first outer circuit board 40 includes a first dielectric layer 41 and a first outer wiring layer 43. The first dielectric layer 41 is combined with the first inner wiring layer 110 and fills the opening 101. The first outer wiring layer 43 is arranged on a side of the first dielectric layer 41 facing away from the first inner wiring layer 110, and the first outer wiring layer 43 is electrically connected to the connecting pad 31.

The second outer circuit board 50 includes a second dielectric layer 51 and a second outer wiring layer 53. The second dielectric layer 51 is combined with a side of the inner circuit board 10a facing away from the first inner wiring layer 110. The second outer wiring layer 53 is arranged on a side of the second dielectric layer 51 facing away from the inner circuit board 10a.

The second dielectric layer 51 may also fill the opening 101.

The materials of first dielectric layer 41 and the second dielectric layer 51 may be selected from, but not limited to at least one of polypropylene, epoxy resin, polyurethane, phenolic resin, urea-formaldehyde resin, melamine-formaldehyde resin, liquid crystal polymer, polyimide, polyetheretherketone, polyethylene terephthalate, polyethylene naphthalate, and the like.

In another embodiment, both the first outer circuit board 40 and the second outer circuit board 50 may be a double-layer circuit board or a multilayer circuit board.

Figure 7:
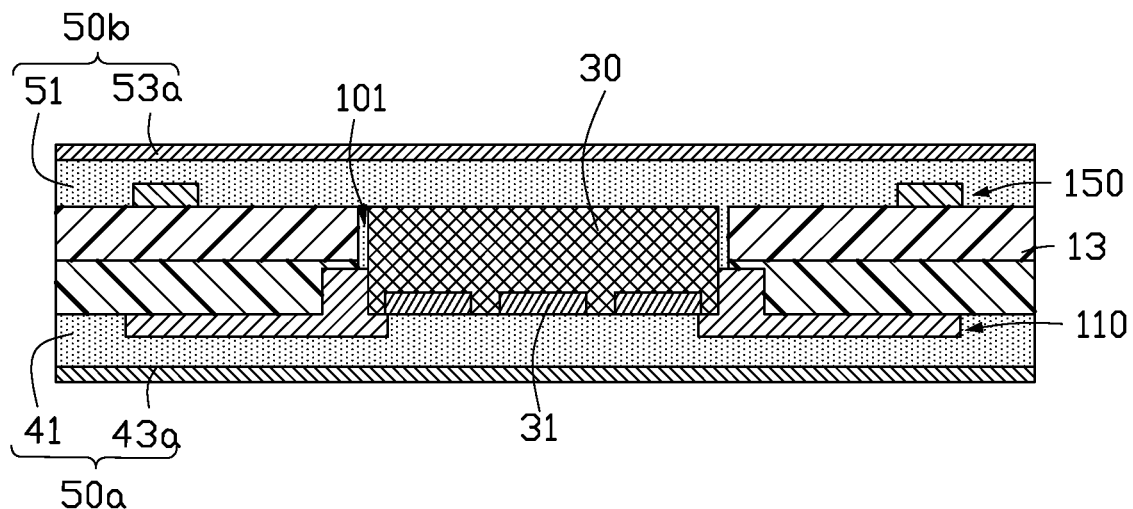
FIG. 7 is a schematic cross-sectional view of pressing a first single-sided board and a second single-sided board on the intermediate structure shown in FIG. 5.

In this embodiment, step S6 of "a first outer circuit board 40 and a second outer circuit board 50 are respectively formed on opposite sides of the intermediate structure 200" specifically includes:

Step S61, referring to FIG. 7, a first single-sided board 50a and a second single-sided board 50b are respectively pressed on opposite sides of the intermediate structure 200.

The first single-sided board 50a includes a first dielectric layer 41 and a first metal foil 43a. The first dielectric layer 41 is combined with the first inner wiring layer 110 and fills the opening 101. The first metal foil 43a is arranged on a side of the first dielectric layer 41 facing away from the first inner wiring layer 110.

The second single-sided board 50b includes a second dielectric layer 51 and a second metal foil 53a. The second dielectric layer 51 is combined with a side of the inner circuit board 10a facing away from the first inner wiring layer 110. The second metal foil 53a is arranged on a side of the second dielectric layer 51 facing away from the inner circuit board 10a.

The second dielectric layer 51 may also fill the opening 101.

Step S62, referring to FIG. 6, a circuit manufacturing technology is performed on the first single-sided board 50a and the second single-sided board 50b, so that the first metal foil 43a correspondingly forms a first outer wiring layer 43, the second metal foil 53a correspondingly forms a second outer wiring layer 53, and at least one electrically conductive structure 45 is formed to electrically connected to the first outer wiring layer 43 and the connecting pad 31, thereby forming the first outer circuit board 40 and the second outer circuit board 50.

Figure 8:
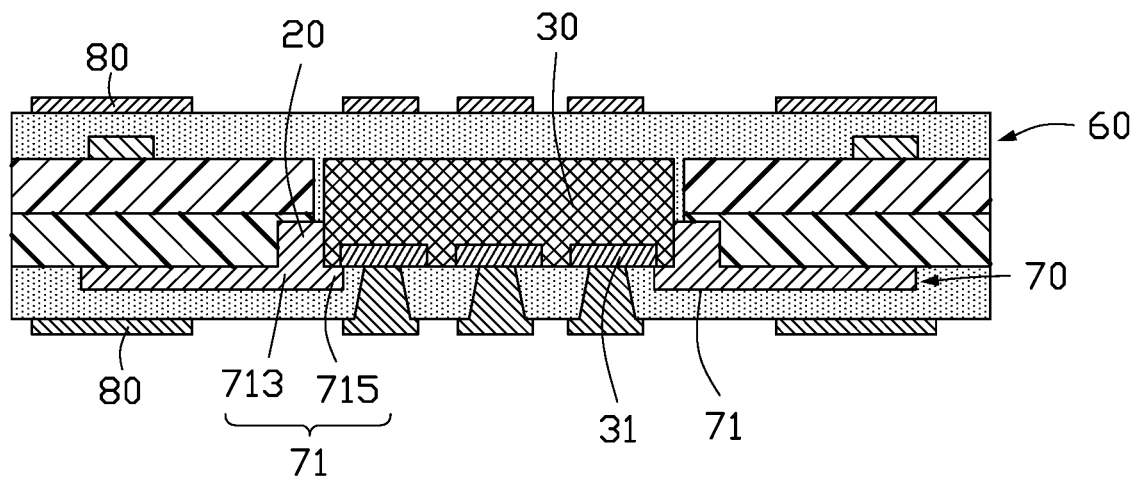
FIG. 8 is a schematic cross-sectional view of a packaging structure of an embodiment of the present invention.

Referring to FIG. 8, an embodiment of the present invention provides a package structure 100, which includes a dielectric layer 60, at least one inner wiring layer 70, at least two outer wiring layers 80, and at least one electronic component 30. The at least one inner wiring layer 70 is embedded in the dielectric layer 60. The at least two outer wiring layers 80 are arranged on two sides of the at least one inner wiring layer 70 and combined with the dielectric layer 60. Each inner wiring layer 70 includes at least two spaced supporting pads 71, and each supporting pad 71 includes a main body 713 and a protruding portion 113b extending outward from a periphery of the main body 113a. The packaging structure 100 further includes at least two spaced positioning pillars 20, and each positioning pillar 20 is correspondingly connected to one main body 713. Each electronic component 30 is embedded in the electronic component 30, arranged between at least two positioning pillars 20, and an end of each electronic component 30 is in contact with protruding portions 715 of at least two supporting pads 71. The electronic component 30 is electrically connected to the outer wiring layers 80.

In this embodiment, the dielectric layer 60 may be selected from, but not limited to at least one of polypropylene, epoxy resin, polyurethane, phenolic resin, urea-formaldehyde resin, melamine-formaldehyde resin, liquid crystal polymer, polyimide, polyetheretherketone, polyethylene terephthalate, polyethylene naphthalate, and the like.

Lengths of the protruding portions 715 extending in different directions from the periphery of the main body 713 are the same or different.

The packaging structure 100 further includes at least one connecting pad 31 formed on at least one of a side of the electronic component 30 facing the first inner wiring layer 70 and a side of the electronic component 30 facing away from the inner wiring layer 70 contacting the electronic component 30. The connecting pad 31 is electrically connected to the outer wiring layers 80.

In this embodiment, the connecting pad 31 is arranged between the protruding portions 715 which is supporting the electronic component 30.

In the method for manufacturing the packaging structure, when the electronic component 30 is installed, the protruding portions 113b(715) exposed from the opening 101 is used to support the electronic component 30 to instead of the traditional peelable adhesive layer to support the electronic component 30, thereby avoiding a problem of residual glue that exists when the peelable adhesive layer is removed, and the step of the sticking adhesive layer and tearing the adhesive layer; supporting the electronic component 30 by the protruding portions 113b(715) exposed from the opening 101 may also simultaneously perform packaging on both sides of the inner circuit board 10a where the electronic component 30 is mounted, simplifying the packaging process and preventing a prepreg line from being produced by a secondary compression during packaging. Secondly, the electronic component 30 is installed between at least two positioning posts 20, to position the electronic component 30 when the electronic component 30 is packaged, thereby improving the packaging accuracy of the electronic component 30.

The above is only the preferred embodiment of the present invention, and does not limit the present invention in any form. Although the present invention has been disclosed as the preferred embodiment, it is not intended to limit the present invention. Any person skilled in the art, without departing from the scope of the technical solution of the present invention, when the technical contents disclosed above can be used to make some changes or modifications to equivalent implementations, if without departing from the technical solution content of the present invention, any simple modifications, equivalent changes and modifications made to the above embodiments based on the technical essence of the present invention still fall within the scope of the technical solution of the present invention.

What is claimed is:

1. A method for manufacturing a packaging structure, comprising:
    providing a substrate comprising an insulating layer and a first metal layer formed on a side of the insulating layer;
    forming at least two spaced grooves on the substrate, each groove passing through the first metal layer and a part of the insulating layer;
    forming a positioning pillar corresponding to each of the at least two spaced grooves to fill the groove, and forming an inner circuit board by performing a circuit manufacturing technology on the substrate, wherein the first metal layer correspondingly forms a first inner wiring layer, the first inner wiring layer comprises at least two spaced supporting pads, and each supporting pad comprises a main body and a protruding portion extending outward from a periphery of the main body, the main body corresponds to the positioning pillar;
    forming at least one opening passing through the inner circuit board, each opening exposing a partial region of each of the protruding portions of at least two supporting pads;
    placing an electronic component in the opening, and supporting the electronic component by the protruding portions to form an intermediate structure;
    forming a first outer circuit board and a second outer circuit board respectively on opposite sides of the intermediate structure to encapsulate the electronic component, thereby obtaining the packaging structure.

2. The method for manufacturing the packaging structure of claim 1, wherein the step of "forming at least one opening passing through the inner circuit board" further comprises: a part of a surface of each positioning pillar facing away from the corresponding supporting pads is exposed from the opening.

3. The method for manufacturing the packaging structure of claim 1, wherein the substrate further comprises a second metal layer formed on a side of the insulating layer facing away from the first metal layer, the step of "forming a positioning pillar corresponding to the groove to fill the groove, and forming an inner circuit board by performing a circuit manufacturing technology on the substrate" further comprises: the second metal layer correspondingly forms a second inner wiring layer.

4. The method for manufacturing the packaging structure of claim 1, wherein at least one connecting pad is formed on a side of the electronic component facing the first inner wiring layer and a side of the electronic component facing away from the first inner wiring layer, the electronic component is electrically connected to the first outer circuit board and/or the second outer circuit board through the connecting pad.

5. The method for manufacturing the packaging structure of claim 1, wherein the first outer circuit board comprises a first dielectric layer and a first outer wiring layer, the first dielectric layer is combined with the first inner wiring layer and fills the opening, the first outer wiring layer is arranged on a side of the first dielectric layer facing away from the first inner wiring layer.

6. The method for manufacturing the packaging structure of claim 1, wherein the second outer circuit board comprises a second dielectric layer and a second outer wiring layer, the second dielectric layer is combined with a side of the inner circuit board facing away from the first inner wiring layer and fills the opening, the second outer wiring layer is arranged on a side of the second dielectric layer facing away from the inner circuit board.

7. The method for manufacturing the packaging structure of claim 1, wherein lengths of the protruding portions extending in different directions from the periphery of the main body are the same or different.

* * * * *